(12) United States Patent
Dai (10) Patent No.: US 9,767,754 B2
(45) Date of Patent: *Sep. 19, 2017

(54) SCAN DRIVING CIRCUIT FOR OXIDE SEMICONDUCTOR THIN FILM TRANSISTORS

(71) Applicant: Shenzhen China Star Optoelectronics Technology Co., Ltd., Shenzhen, Guangdong (CN)

(72) Inventor: Chao Dai, Guangdong (CN)

(73) Assignee: Shenzhen China Star Optelectronics Technology Co., Ltd., Shenzhen, Guangdong (CN)

(*) Notice: Subject to any disclaimer, the term of this patent is extended or adjusted under 35 U.S.C. 154(b) by 0 days.

This patent is subject to a terminal disclaimer.

(21) Appl. No.: 15/352,486

(22) Filed: Nov. 15, 2016

(65) Prior Publication Data

US 2017/0061915 A1 Mar. 2, 2017

Related U.S. Application Data

(62) Division of application No. 14/424,383, filed on Feb. 26, 2015, now Pat. No. 9,548,036.

(30) Foreign Application Priority Data

Nov. 7, 2014 (CN) .......................... 2014 1 0624066

(51) Int. Cl.
*G09G 3/36* (2006.01)
*H01L 27/12* (2006.01)

(52) U.S. Cl.
CPC ......... *G09G 3/3677* (2013.01); *G09G 3/3696* (2013.01); *G09G 2300/0408* (2013.01); *G09G 2310/0289* (2013.01); *G09G 2310/06* (2013.01); *G09G 2310/08* (2013.01); *H01L 27/1225* (2013.01)

(58) Field of Classification Search
CPC ......... G09G 2310/0286; G09G 3/3677; G09G 2300/0408; G09G 3/3648; G09G 3/3674; G09G 3/3696; G09G 3/3655; G09G 2310/0267; G09G 2310/0289
USPC ................. 377/54, 64; 345/87, 99, 100, 204
See application file for complete search history.

(56) References Cited

U.S. PATENT DOCUMENTS

| | | | | |
|---|---|---|---|---|
| 8,971,479 B2 * | 3/2015 | Chang | ................. | G09G 3/3655 377/64 |
| 2009/0122951 A1 * | 5/2009 | Tobita | .................... | G11C 19/28 377/68 |
| 2010/0260312 A1 * | 10/2010 | Tsai | ..................... | G09G 3/3677 377/79 |

* cited by examiner

*Primary Examiner* — Koosha Sharifi-Tafreshi
(74) *Attorney, Agent, or Firm* — Andrew C. Cheng (57) ABSTRACT

Disclosed is a scan driving circuit for oxide semiconductor thin film transistors, in which a pull-down holding circuit part includes a main inverter and an auxiliary inverter. By introducing a constant low voltage level (DCL) and setting the constant low voltage level (DCL) less than the second negative voltage level (VSS2), which is in turn less than the first negative voltage level (VSS1), the influence of electrical property of the oxide semiconductor thin film transistors to the scan driving circuit, particularly the bad function due to the electric leakage issue, can be prevented to ensure that the pull-down holding circuit part can be normally pulled down in the functioning period and at higher voltage level in a non-functioning period to effectively maintain the first node (Q(N)) and the output end (G(N)) at low voltage level.

12 Claims, 6 Drawing Sheets

SCAN DRIVING CIRCUIT FOR OXIDE SEMICONDUCTOR THIN FILM TRANSISTORS

CROSS REFERENCE TO RELATED APPLICATIONS

This application is a divisional application of co-pending U.S. patent application Ser. No. 14/424,383, filed on Feb. 26, 2015.

BACKGROUND OF THE INVENTION

1. Field of the Invention

The present invention relates to a display skill field, and more particularly to a scan driving circuit for the oxide semiconductor thin film transistors.

2. The Related Arts

GOA (Gate Drive On Array) is to manufacture the gate driver on the array substrate by utilizing the thin film transistor (TFT) liquid crystal display array process for achieving the driving method of scanning line by line.

Generally, the GOA circuit comprises a pull-up part, a pull-up controlling part, a transfer part, a pull-down part, a pull-down holding part and a boost part in charge of boosting voltage level. The boost part generally comprises a bootstrap capacitor.

The pull-up part is mainly in charge of outputting the inputted clock signal (Clock) to the gate of the thin film transistor as being the driving signals of the liquid crystal display. The pull-up control part is mainly in charge of activating the pull-up part, and is generally functioned by the signal transferred from the former GOA circuit. The pull-down part is mainly in charge of rapidly pulling down the scan signal (i.e. the voltage level of the gate of the thin film transistor) to be low voltage level after outputting the scanning signal. The pull-down holding circuit part is mainly in charge of maintaining the scanning signal and the signal of the pull-up part in an off state (i.e. the set negative voltage level). The boost part in mainly in charge of performing a second boost to the voltage level of the pull-up part for ensuring the normal output of the pull-up part.

With the development of the oxide semiconductor thin film transistor, the peripheral circuit around the panel corresponding to the oxide semiconductor also becomes the focus that people pay lots of attentions. Because the carrier mobility of the oxide semiconductor thin film transistor is 20-30 times of the amorphous silicon thin film transistor, which is capable of magnificently raising the charging/discharging rate of TFT to the pixel electrodes to promote the response speed of the pixels and to realize faster refreshing rate. In the mean time, the line scan rate of the pixels also can be significantly promoted to make the production of the flat panel display with ultra high resolution possible. Therefore, the GOA circuit of oxide semiconductor thin film transistor has potential to replace the GOA circuit of amorphous silicon thin film transistor. In prior arts, only a few developments are proceeded for focusing on the GOA circuit of oxide semiconductor thin film transistor. Particularly, many problems caused by the electrical property of the oxide thin film transistors themselves have to be overcome. For instance, threshold voltage is generally larger than 0V in the electrical property of the traditional amorphous silicon thin film transistor and the swing of the subthreshold range voltage is relatively larger than the electrical current. Therefore, in the design of the circuit, the generated leakage current is smaller even when the voltage Vgs between the gate and the source is about 0V in some transistors operations. However, the threshold voltage of the oxide semiconductor thin film transistor is about 0V and the subthreshold range swing is smaller because the material property thereof has significant differences from the amorphous silicon. Many elements may function at Vgs=0V when the GOA circuit is in an off state. Accordingly, the design difficulty of a GOA circuit for the oxide semiconductor thin film transistors will be increased. There will be some function issues happening when the design adaptable to the scan driving circuit for the amorphous silicon semiconductors is applied to the oxide semiconductor. Besides, due to some external factor inductions and the stress effect, there will be a tendency that the threshold voltage diminishes toward minus value to the oxide semiconductor thin film transistor, which may directly results in malfunction of the GOA circuit for the oxide semiconductor thin film transistors. Therefore, the influence of the element property to the GOA circuit has to be considered as designing the circuit.

SUMMARY OF THE INVENTION

An objective of the present invention is to provide a scan driving circuit for the oxide semiconductor thin film transistors to eliminate the influence of electrical property of the oxide semiconductor thin film transistors to the GOA driving circuit, particularly the bad function due to the electric leakage issue for solving issues that the pull-down holding circuit part in the scan driving circuit for the oxide thin film transistors cannot be at higher voltage level in a non-functioning period.

For realizing the aforesaid objective, the present invention provides a scan driving circuit for the oxide semiconductor thin film transistors, comprising a plurality of GOA units which are cascade connected, and N is set to be a positive integer and the Nth GOA unit comprises a pull-up control part, a pull-up part, a transfer part, a first pull-down part, a bootstrap capacitor part and a pull-down holding part;

the pull-up control part comprises an eleventh transistor, and a gate of the eleventh transistor is electrically coupled to a driving output end of a N−1th GOA unit which is the former stage of the Nth GOA unit, and a drain is electrically coupled to an output end of the N−1th GOA unit which is the former stage of the Nth GOA unit, and a source is electrically coupled to a first node;

the first pull-down part comprises a forty-first transistor, and a gate of the forty-first transistor is electrically coupled to a M+2 set clock signal, and a drain is electrically coupled to the first node, and a source is electrically coupled to a second negative voltage level or an output end;

the pull-down holding circuit part comprises a fifty-first transistor, and both a gate and a drain of the fifty-first transistor are electrically coupled to a constant high voltage level, and a source is electrically coupled to a fourth node; a fifty-second transistor, and a gate of the fifty-second transistor is electrically coupled to the first node, and a drain is electrically coupled to the fourth node, and a source is electrically coupled to a first negative voltage level; a fifty-third transistor, and a gate of the fifty-third transistor is electrically coupled to the fourth node, and a drain is electrically coupled to the constant high voltage level, and a source is electrically coupled to a second node; a fifty-fourth transistor, and a gate of the fifty-fourth transistor is electrically coupled to the first node, and a drain is electrically coupled to the second node, and a source is electrically coupled to a third node; a seventy-third transistor, and a gate of the seventy-third transistor is electrically coupled to the fourth node, and a drain is electrically coupled to the constant high voltage level, and a source is electrically coupled to the third node; a seventy-fourth transistor, and a gate of the seventy-fourth transistor is electrically coupled to the first node, and a drain is electrically coupled to the third node, and a source is electrically coupled to a constant low voltage level; a forty-second transistor, and a gate of the forty-second transistor is electrically coupled to the second node, and a drain is electrically coupled to the first node, and a source is electrically coupled to the second negative voltage level; a thirty-second transistor, and a gate of the thirty-second transistor is electrically coupled to the second node, and a drain is electrically coupled to the output end, and a source is electrically coupled to the first negative voltage level;

the fifty-first transistor, the fifty-second transistor, the fifty-third transistor, the fifty-fourth transistor construct a main inverter, and the main inverter is employed to control the thirty-second transistor and the forty-second transistor; the seventy-third transistor and the seventy-fourth transistor construct an auxiliary inverter, and the auxiliary inverter is employed to provide a low voltage level to the main inverter in a functioning period, and a high voltage level to the main inverter in a non-functioning period;

a relationship among the first negative voltage level, the second negative voltage level and the constant low voltage level is that the constant low voltage level is less than the second negative voltage level, which in turn is less than the first negative voltage level.

The auxiliary inverter further comprises a seventy-first transistor, and both a gate and a drain of the seventy-first transistor are electrically coupled to the constant high voltage level, and a source is electrically coupled to the gate of the seventy-third transistor; a seventy-second transistor, and a gate of the seventy-second transistor is electrically coupled to the first node, and a drain is electrically coupled to the gate of the seventy-third transistor, and a source is electrically coupled to the constant low voltage level; and the gate of the seventy-third transistor is off with the fourth node.

A stage transfer employed by the scan driving circuit is that the N−1th stage transfers signals to the Nth stage.

The pull-up part comprises a twenty-first transistor, and a gate of the twenty-first transistor is electrically coupled to the first node, and a drain is electrically coupled to a clock signal, and a source is electrically coupled to the output end;

the transfer part comprises a twenty-second transistor, and a gate of the twenty-second transistor is electrically coupled to the first node, and a drain is electrically coupled to the clock signal, and a source is electrically coupled to a driving output end;

the boost capacitor part comprises a capacitor, and one end of the capacitor is electrically coupled to the first node, and the other end is electrically coupled to the output end.

In the first level connection of the scan driving circuit, both the gate and the drain of the eleventh transistor are electrically coupled to an activation signal end of the circuit.

A waveform duty ratio of the clock signal cannot be larger than 25/75.

The waveform duty ratio of the clock signal is 25/75.

A signal output waveform of the first node appears to be convex.

The clock signal comprises four sets of clock signals: a first clock signal, a second clock signal, a third clock signal, a fourth clock signal. When the clock signal is the third clock signal, the M+2 set clock signal is the first clock signal. When the clock signal is the fourth clock signal, the M+2 set clock signal is the second clock signal.

The benefits of the present invention are: the present invention provides a scan driving circuit for the oxide semiconductor thin film transistors. The pull-down holding circuit part employed in the scan driving circuit for the oxide semiconductor thin film transistors comprises a main inverter and an auxiliary inverter. By introducing a constant low voltage level and setting the constant low voltage level less than the second negative voltage level, which in turn less than the first negative voltage level, the influence of electrical property of the oxide semiconductor thin film transistors to the scan driving circuit, particularly the bad function due to the electric leakage issue, can be prevented to ensure that the pull-down holding circuit part can be normally pulled down in the functioning period and at higher voltage level in a non-functioning period to effectively maintain the first node and the output end at low voltage level.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In the drawing.

DETAILED DESCRIPTION OF THE PREFERRED EMBODIMENTS

For better explaining the technical solution and the effect of the present invention, the present invention will be further described in detail with the accompanying drawings and the specific embodiments.

Figure 1:
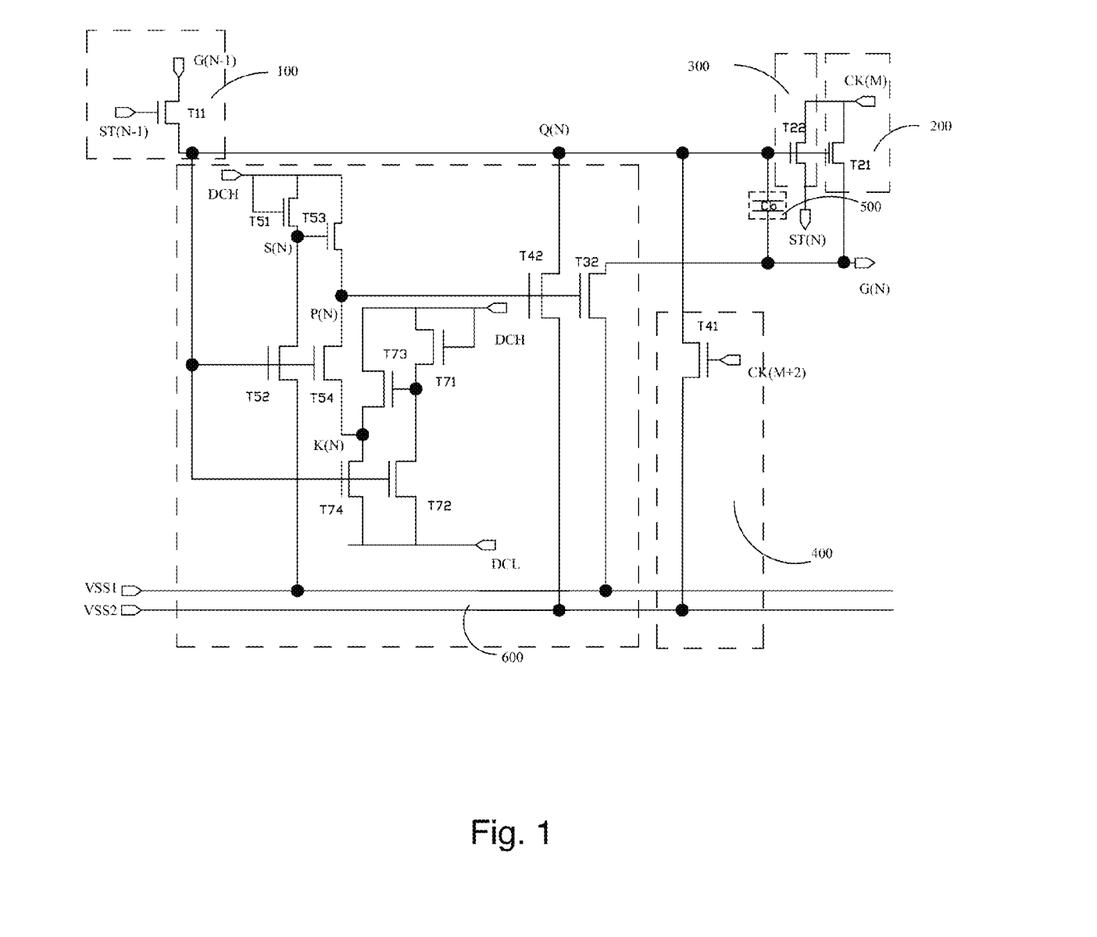
FIG. 1 is a circuit diagram of a scan driving circuit for oxide semiconductor thin film transistors according to the first embodiment of the present invention.
Figure 2:
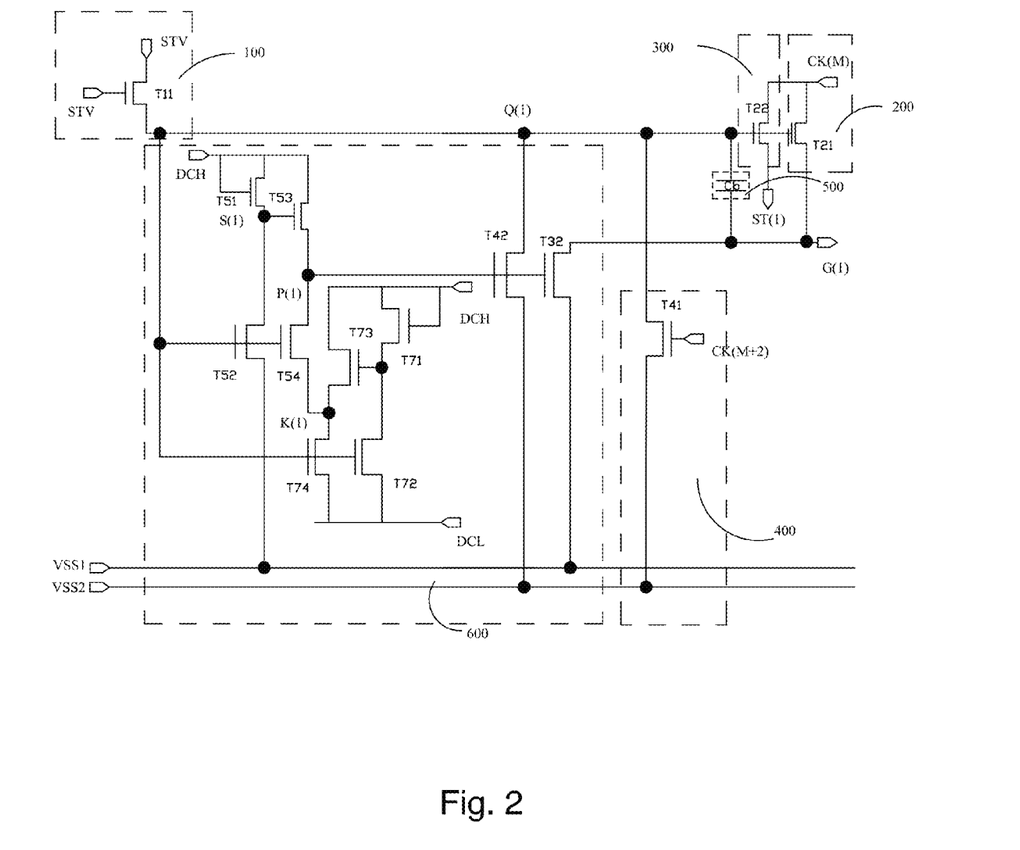
FIG. 2 is a circuit diagram of the first level GOA unit according to the first embodiment shown in FIG. 1.

Referring to FIGS. 1-2, which are a scan driving circuit for oxide semiconductor thin film transistors according to the first embodiment of the present invention. As shown in FIG. 1, the scan driving circuit for the oxide semiconductor thin film transistors is a scan driving circuit for indium gallium zinc oxide (IGZO) thin film transistor, comprising a plurality of GOA units which are cascade connected, and N is set to be a positive integer and the Nth GOA unit comprises a pull-up control part 100, a pull-up part 200, a transfer part 300, a first pull-down part 400, a bootstrap capacitor part 500 and a pull-down holding part 600.

The components of the respective parts and the specific connections are described below:

The pull-up control part 100 comprises an eleventh transistor T11, and a gate of the eleventh transistor T11 is electrically coupled to a driving output end of a N−1th GOA unit which is the former stage of the Nth GOA unit, and a drain is electrically coupled to an output end ST(N−1) of the N−1th GOA unit which is the former stage of the Nth GOA unit, and a source is electrically coupled to a first node Q(N).

The pull-up part 200 comprises a twenty-first transistor T21, and a gate of the twenty-first transistor T21 is electrically coupled to the first node Q(N), and a drain is electrically coupled to a clock signal CK(M), and a source is electrically coupled to the output end G(N).

The transfer part 300 comprises a twenty-second transistor T22, and a gate of the twenty-second transistor T22 is electrically coupled to the first node Q(N), and a drain is electrically coupled to the clock signal CK(M), and a source is electrically coupled to a driving output end ST(N).

The first pull-down part 400 merely comprises a forty-first transistor T41, and a gate of the forty-first transistor T41 is electrically coupled to a M+2 set clock signal CK(M+2), and a drain is electrically coupled to the first node Q(N), and a source is electrically coupled to a second negative voltage level VSS2.

The boost capacitor part 500 comprises a capacitor Cb, and one end of the capacitor Cb is electrically coupled to the first node Q(N), and the other end is electrically coupled to the output end G(N).

The pull-down holding circuit part 600 comprises a fifty-first transistor T51, and both a gate and a drain of the fifty-first transistor T51 are electrically coupled to a constant high voltage level DCH, and a source is electrically coupled to a fourth node S(N).

A fifty-second transistor T52 is provided, and a gate of the fifty-second transistor T52 is electrically coupled to the first node Q(N), and a drain is electrically coupled to the fourth node S(N), and a source is electrically coupled to a first negative voltage level VSS1.

A fifty-third transistor T53 is provided, and a gate of the fifty-third transistor T53 is electrically coupled to the fourth node S(N), and a drain is electrically coupled to the constant high voltage level DCH, and a source is electrically coupled to a second node P(N).

A fifty-fourth transistor T54 is provided, and a gate of the fifty-fourth transistor T54 is electrically coupled to the first node Q(N), and a drain is electrically coupled to the second node P(N), and a source is electrically coupled to a third node K(N).

A seventy-first transistor T71 is provided, and both a gate and a drain of the seventy-first transistor T71 are electrically coupled to the constant high voltage level DCH, and a source is electrically coupled to the gate of the seventy-third transistor T73.

A seventy-second transistor T72 is provided, and a gate of the seventy-second transistor T72 is electrically coupled to the first node Q(N), and a drain is electrically coupled to the gate of the seventy-third transistor T73, and a source is electrically coupled to the constant low voltage level DCL.

A seventy-third transistor T73 is provided, and a gate of the seventy-third transistor T73 is electrically coupled to the source of the seventy-first transistor T71, and a drain is electrically coupled to the constant high voltage level DCH, and a source is electrically coupled to the third node K(N).

A seventy-fourth transistor T74 is provided, and a gate of the seventy-fourth transistor T74 is electrically coupled to the first node Q(N), and a drain is electrically coupled to the third node K(N), and a source is electrically coupled to a constant low voltage level DCL.

A forty-second transistor T42 is provided, and a gate of the forty-second transistor T42 is electrically coupled to the second node P(N), and a drain is electrically coupled to the first node Q(N), and a source is electrically coupled to the second negative voltage level VSS2.

A thirty-second transistor T32 is provided, and a gate of the thirty-second transistor T32 is electrically coupled to the second node P(N), and a drain is electrically coupled to the output end G(N), and a source is electrically coupled to the first negative voltage level VSS1.

Specifically, first, a relationship among the first negative voltage level VSS1, the second negative voltage level VSS2 and the constant low voltage level DCL is that the constant low voltage level DCL is less than the second negative voltage level VSS2, which is in turn less than the first negative voltage level VSS1.

Then, a stage transfer employed by the scan driving circuit is that the N−1th stage transfers signals to the Nth stage. As shown in FIG. 2, in the first level connection of the scan driving circuit, the gate and the drain of the eleventh transistor T11 are electrically coupled to an activation signal end SW of the circuit.

Again, in the first pull-down part 400, only the forty-first transistor T41 is in charge of pulling down the first node Q(N), and the gate of the forty-first transistor T41 is electrically coupled to the M+2 set clock signal, and the source of the T41 is electrically coupled to the second negative voltage level VSS2. The clock signal CK(M) comprises four sets of clock signals: a first clock signal CK(1), a second clock signal CK(2), a third clock signal CK(3), a fourth clock signal CK(4). When the clock signal CK(M) is the third clock signal CK(3), the M+2 set clock signal CK(M+2) is the first clock signal CK(1). When the clock signal CK(M) is the fourth clock signal CK(4), the M+2 set clock signal CK(M+2) is the second clock signal CK(2). Moreover, a waveform duty ratio of the clock signal CK(M) cannot be larger than 25/75 for ensuring that a signal output waveform of the first node Q(N) appears to be convex. Preferably, the waveform duty ratio of the clock signal CK(M) is 25/75.

Significantly, the pull-down holding circuit part 600 employs a special double inverters design. Four transistors, the fifty-first transistor T51, the fifty-second transistor T52, the fifty-third transistor T53, the fifty-fourth transistor T54 construct a main inverter, and four transistors, including the seventy-first transistor T71, the seventy-second transistor T72, the seventy-third transistor T73 and the seventy-fourth transistor T74, construct an auxiliary inverter. The main inverter is employed to control two transistors, the thirty-second transistor T32 and the forty-second transistor T42, and the auxiliary inverter is employed to provide a low voltage level to the main inverter in a functioning period, and a proper high voltage level to the main inverter in a non-functioning period for reducing the electric leakage of the fifty-fourth transistor T54 to ensure that the main inverter generates higher voltage level in the non-functioning period.

In the functioning period, after the auxiliary inverter is driven by high/low voltages, the constant high voltage level DCH and the constant low voltage level DCL, the fifty-second transistor T52 is pulled down to the first negative voltage level VSS1, and the seventy-fourth transistor T74, seventy-second transistor T72 are activated and pull down the constant high voltage level DCH to make the third node K(N) become lower voltage level when the first node Q(N) is high voltage level. The second node P(N) is also pulled down to a lower voltage level. That is to say, the auxiliary inverter provides a low voltage level to the main inverter in a functioning period to prevent that the electric leakages happen to the thirty-second transistor T32, the forty-second transistor T42 because the threshold voltages are lower and the physical property of approaching 0V. Then, the pull-down holding circuit part 600 can be normally pulled down in the functioning period.

In the non-functioning period, all of the fifty-second transistor T52, the fifty-fourth transistor T54, the seventy-second transistor T72, the seventy-fourth transistor T74 are deactivated and off. Because the gate of the fifty-fourth transistor T54 is electrically coupled to the first node Q(N), and the source is electrically coupled to the third node K(N), and the gate of the fifty-fourth transistor T54 is negative voltage level and the source is positive voltage level, such Vgs is a relatively pretty negative voltage level, and the fifty-fourth transistor T54 can be off very well to reduce its electrical leakage. That is to say, the auxiliary inverter provides a proper high voltage level to the main inverter in a non-functioning period for reducing the electric leakage of the fifty-fourth transistor T54 to ensure that the pull-down holding circuit part 600 is at higher voltage level in the non-functioning period to effectively maintain the first node Q(N) and the output end G(N) at low voltage level. Besides, as the third node K(N) is high voltage level, it also has a function of resistance divider which can push the voltage level of the second node P(N) to be higher and therefore, to stable the voltage level of the second node P(N).

Figure 3:
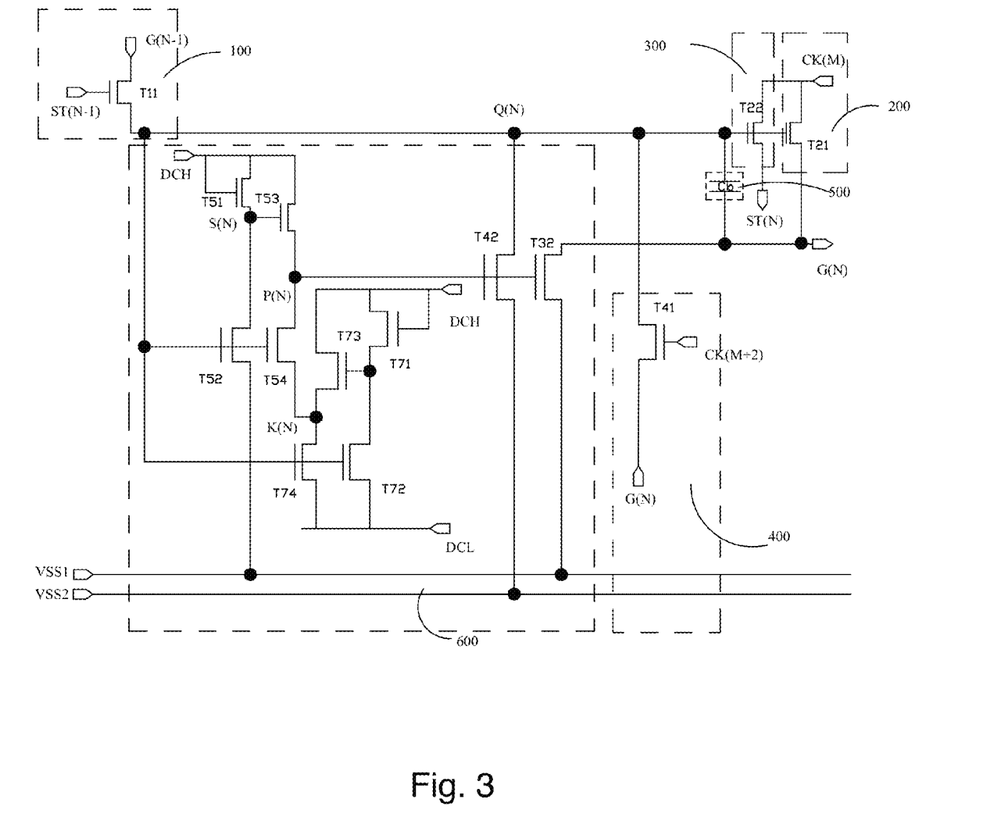
FIG. 3 is a circuit diagram of a scan driving circuit for oxide semiconductor thin film transistors according to the second embodiment of the present invention.

Referring to FIG. 3, which is a scan driving circuit for oxide semiconductor thin film transistors according to the second embodiment of the present invention, a difference of the second embodiment from the first embodiment is that the source of the forty-first transistor T41 is electrically coupled to the output end G(N). By electrically coupling the source of the forty-first transistor T41 to the output end G(N), the electrical leakage of the first node Q(N) in the functioning period via the forty-first transistor T41 can be reduced. Except this, the parts bearing the same reference numerals in FIG. 3 and FIG. 1 have the same components, connections, functions and operation principles. Repeated description will be omitted here.

Figure 4:
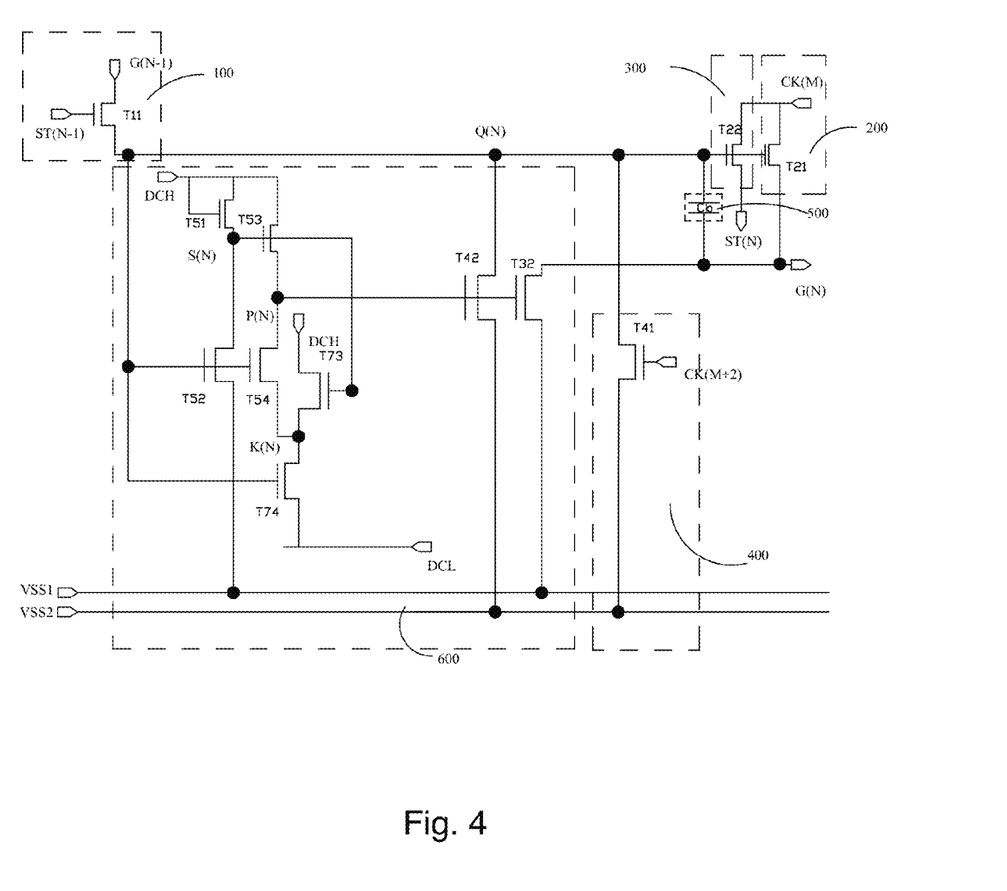
FIG. 4 is a circuit diagram of a scan driving circuit for oxide semiconductor thin film transistors according to the third embodiment of the present invention.

Referring to FIG. 4, which is a circuit diagram of a scan driving circuit for oxide semiconductor thin film transistors according to the third embodiment of the present invention, a difference of the third embodiment from the first embodiment is that the seventy-first transistor T71 and the seventy-second transistor T72 are removed from the auxiliary inverter part. The gate of the seventy-third transistor T73 is electrically coupled to the fourth node S(N) and the auxiliary inverter is constructed merely with the seventy-third transistor T73 and the seventy-fourth transistor T74. The auxiliary inverter utilizes the fourth node S(N) in the main inverter to control the seventy-third transistor T73. The element amount of the auxiliary inverter can be decreased without extra elements for generating waveform similar to the S(N) node to control the seventy-third transistor T73.

In the functioning period, after the auxiliary inverter is driven by high/low voltages, the constant high voltage level DCH and the constant low voltage level DCL via the fourth node S(N), the fifty-second transistor T52 is pulled down to the first negative voltage level VSS1, and the seventy-fourth transistor T74 is activated and pull down the constant high voltage level DCH to make the third node K(N) become lower voltage level when the first node Q(N) is high voltage level. The second node P(N) is also pulled down to a lower voltage level. That is to say, the auxiliary inverter provides a low voltage level to the main inverter in a functioning period to prevent that the electric leakages happen to the thirty-second transistor T32, the forty-second transistor T42 because the threshold voltages are lower and the physical property of approaching 0V. Then, the pull-down holding circuit part 600 can be normally pulled down in the functioning period.

In the non-functioning period, all of the fifty-second transistor T52, the fifty-fourth transistor T54, the seventy-fourth transistor T74 are deactivated and off. Because the gate of the fifty-fourth transistor T54 is electrically coupled to the first node Q(N), and the source is electrically coupled to the third node K(N), and the gate of the fifty-fourth transistor T54 is negative voltage level and the source is positive voltage level, such Vgs is a relatively pretty negative voltage level, and the fifty-fourth transistor T54 can be off very well to reduce its electrical leakage. That is to say, the auxiliary inverter provides a proper high voltage level to the main inverter in a non-functioning period for reducing the electric leakage of the fifty-fourth transistor T54 to ensure that the pull-down holding circuit part 600 is at higher voltage level in the non-functioning period to effectively maintain the first node Q(N) and the output end G(N) at low voltage level. Besides, as the third node K(N) is high voltage level, it also has a function of resistance divider which can push the voltage level of the second node P(N) to be higher and therefore, to stable the voltage level of the second node P(N). Except this, the parts bearing the same reference numerals in FIG. 4 and FIG. 1 have the same components, connections, functions and operation principles. Repeated description will be omitted here.

Figure 5:
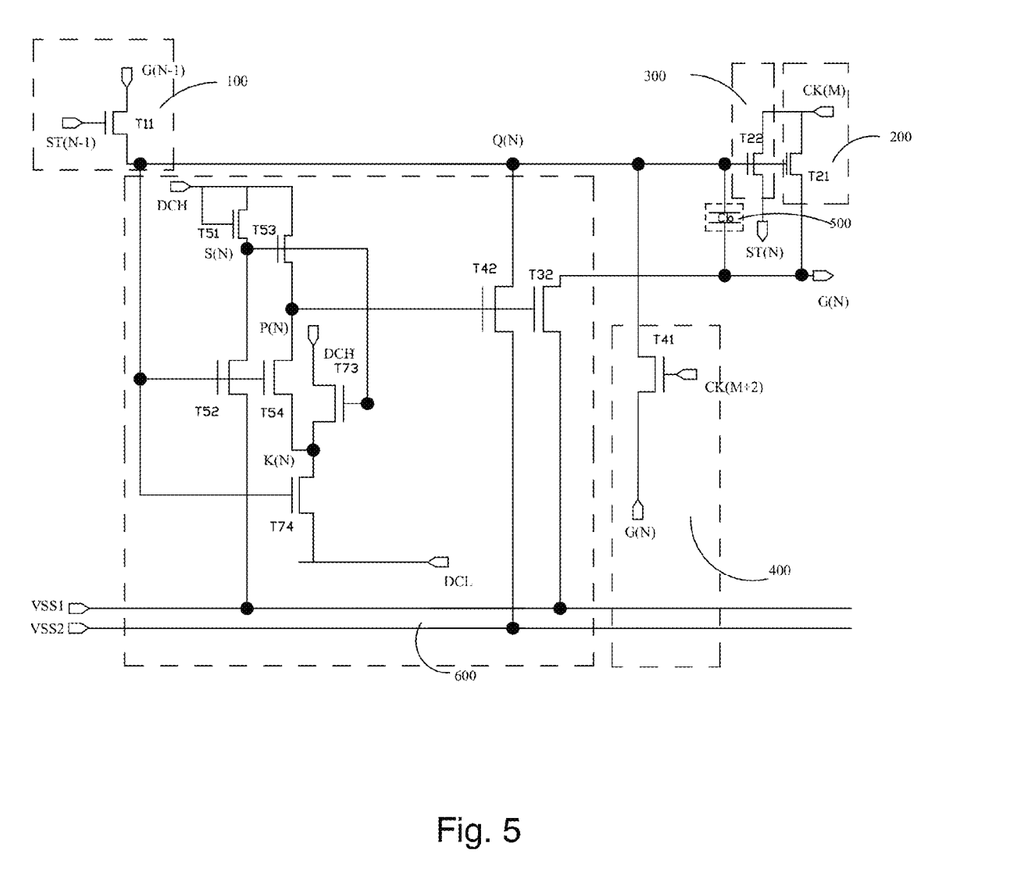
FIG. 5 is a circuit diagram of a scan driving circuit for oxide semiconductor thin film transistors according to the fourth embodiment of the present invention.

Referring to FIG. 5, which is a circuit diagram of a scan driving circuit for oxide semiconductor thin film transistors according to the fourth embodiment of the present invention, a difference of the fourth embodiment from the third embodiment is that the source of the forty-first transistor T41 is electrically coupled to the output end G(N). By electrically coupling the source of the forty-first transistor T41 to the output end G(N), the electrical leakage of the first node Q(N) in the functioning period via the forty-first transistor T41 can be reduced. Except this, the parts bearing the same reference numerals in FIG. 5 and FIG. 4 have the same components, connections, functions and operation principles. Repeated description will be omitted here.

Figure 6:
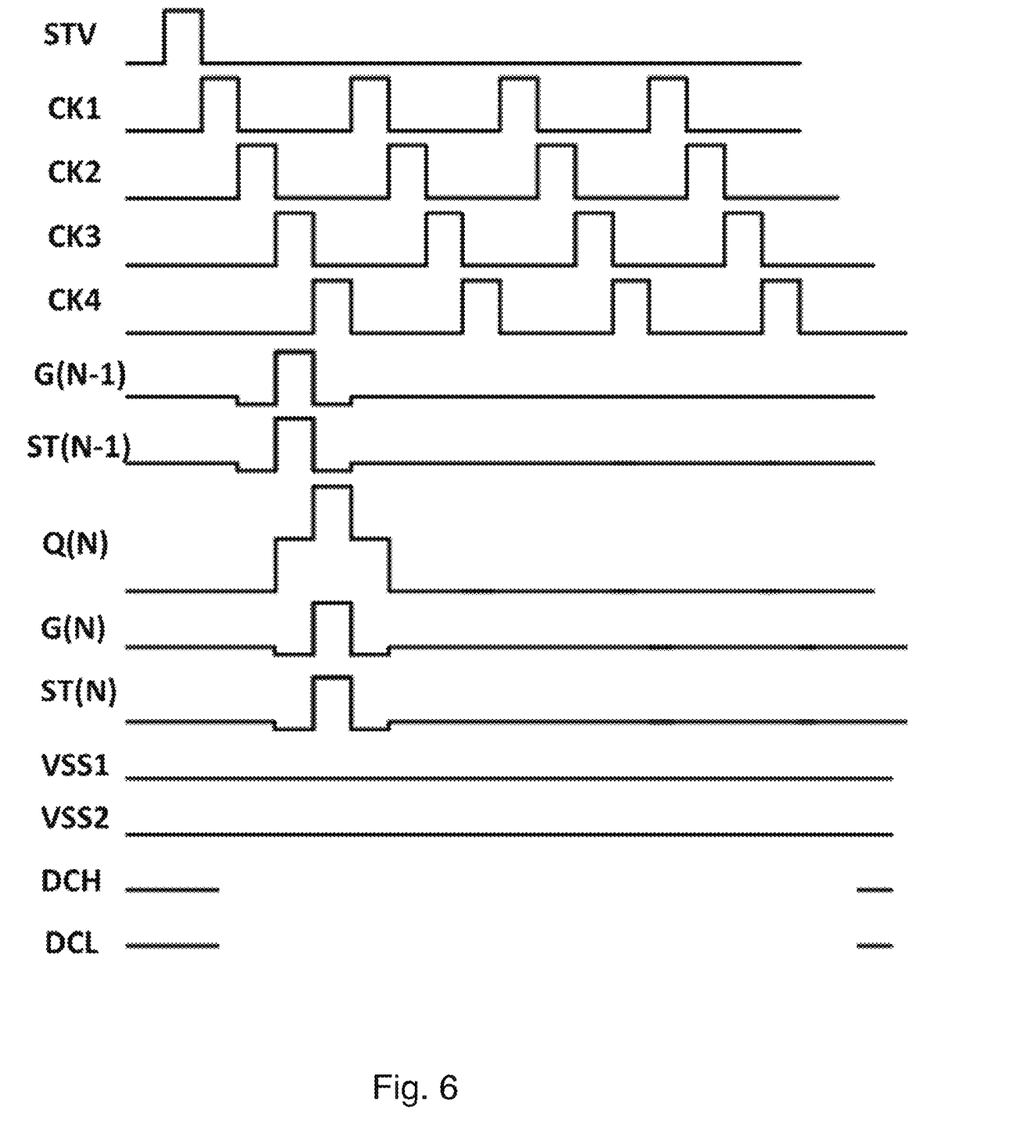
FIG. 6 is an output waveform diagram of the waveform settings and the key nodes in a scan driving circuit for oxide semiconductor thin film transistors according to the present invention.

Referring to FIG. 6, which is an output waveform diagram of the waveform settings and the key nodes in a scan driving circuit for oxide semiconductor thin film transistors according to the present invention, SW is an activation signal; the CK(1)-CK(4) are clock signals of the circuit, which shown here is that the waveform duty ratio of the clock signal is 25/75 for ensuring that a signal output waveform of the first node Q(N) appears to be convex. VSS1, VSS2, DCH, DCL are inputted constant control signals. DCH is high voltage level; all of the VSS1, VSS2, DCL are constant low voltage levels and DCL<VSS2<VSS1; others are waveforms of the output signals at circuit key nodes. As shown in figure: the signal output waveform of the first node Q(N) appears to be convex, and the output end G(N) normally outputs; in the non-functioning period, the first node Q(N) and the output end G(N) are at low voltage level.

In conclusion, the pull-down holding circuit part employed in the scan driving circuit for the oxide semiconductor thin film transistors according to the present invention comprises a main inverter and an auxiliary inverter. By introducing a constant low voltage level and setting the constant low voltage level to be less than the second negative voltage level, which is less than the first negative voltage level, the influence of electrical property of the oxide semiconductor thin film transistors to the scan driving circuit, particularly the bad function due to the electric leakage issue, can be prevented to ensure that the pull-down holding circuit part can be normally pulled down in the functioning period and at higher voltage level in a non-functioning period to effectively maintain the first node and the output end at low voltage level.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A scan driving circuit for oxide semiconductor thin film transistors, comprising: a plurality of gate drive on array (GOA) units which are cascade connected, and N is set to be a positive integer and the Nth GOA unit comprises a pull-up control part, a pull-up part, a transfer part, a first pull-down part, a bootstrap capacitor part and a pull-down holding part;

the pull-up control part comprises an eleventh transistor, and a gate of the eleventh transistor is electrically coupled to a driving output end of a N−1th GOA unit which is the former stage of the Nth GOA unit, and a drain is electrically coupled to an output end of the N−1th GOA unit which is the former stage of the Nth GOA unit, and a source is electrically coupled to a first node;

the first pull-down part comprises a forty-first transistor, and a gate of the forty-first transistor is electrically coupled to a M+2 set clock signal, and a drain is electrically coupled to the first node, and a source is electrically coupled to a second negative voltage level or an output end;

the pull-down holding part comprises a fifty-first transistor, and both a gate and a drain of the fifty-first transistor are electrically coupled to a constant high voltage level, and a source is electrically coupled to a fourth node; a fifty-second transistor, and a gate of the fifty-second transistor is electrically coupled to the first node, and a drain is electrically coupled to the fourth node, and a source is electrically coupled to a first negative voltage level; a fifty-third transistor, and a gate of the fifty-third transistor is electrically coupled to the fourth node, and a drain is electrically coupled to the constant high voltage level, and a source is electrically coupled to a second node; a fifty-fourth transistor, and a gate of the fifty-fourth transistor is electrically coupled to the first node, and a drain is electrically coupled to the second node, and a source is electrically coupled to a third node; a seventy-first transistor, and both a gate and a drain of the seventy-first transistor are electrically coupled to the constant high voltage level, and a source is electrically coupled to the gate of a seventy-third transistor; a seventy-second transistor, and a gate of the seventy-second transistor is electrically coupled to the first node, and a drain is electrically coupled to the gate of the seventy-third transistor, and a source is electrically coupled to the constant low voltage level; a drain of the seventy-third transistor is electrically coupled to the constant high voltage level, and a source is electrically coupled to the third node; a seventy-fourth transistor, and a gate of the seventy-fourth transistor is electrically coupled to the first node, and a drain is electrically coupled to the third node, and a source is electrically coupled to a constant low voltage level; a forty-second transistor, and a gate of the forty-second transistor is electrically coupled to the second node, and a drain is electrically coupled to the first node, and a source is electrically coupled to the second negative voltage level; a thirty-second transistor, and a gate of the thirty-second transistor is electrically coupled to the second node, and a drain is electrically coupled to the output end, and a source is electrically coupled to the first negative voltage level;

the fifty-first transistor, the fifty-second transistor, the fifty-third transistor, the fifty-fourth transistor construct a main inverter, and the main inverter is employed to control the thirty-second transistor and the forty-second transistor; the seventy-first transistor, the seventy-second transistor, the seventy-third transistor and the seventy-fourth transistor construct an auxiliary inverter, and the auxiliary inverter is employed to provide a low voltage level to the main inverter in a functioning period, and a high voltage level to the main inverter in a non-functioning period; and a relationship among the first negative voltage level, the second negative voltage level and the constant low voltage level is that the constant low voltage level is less than the second negative voltage level, which is in turn less than the first negative voltage level.

2. The scan driving circuit for the oxide semiconductor thin film transistors according to claim 1, wherein a stage transfer employed by the scan driving circuit is that the N−1th stage transfers signals to the Nth stage.

3. The scan driving circuit for the oxide semiconductor thin film transistors according to claim 1, wherein the pull-up part comprises a twenty-first transistor, and a gate of the twenty-first transistor is electrically coupled to the first node, and a drain is electrically coupled to a clock signal, and a source is electrically coupled to the output end;

the transfer part comprises a twenty-second transistor, and a gate of the twenty-second transistor is electrically coupled to the first node, and a drain is electrically coupled to the clock signal, and a source is electrically coupled to a driving output end; and the bootstrap capacitor part comprises a capacitor, and one end of the capacitor is electrically coupled to the first node, and the other end is electrically coupled to the output end.

4. The scan driving circuit for the oxide semiconductor thin film transistors according to claim 1, wherein in a first level connection of the scan driving circuit, both the gate and the drain of the eleventh transistor are electrically coupled to an activation signal end of the circuit.

5. The scan driving circuit for the oxide semiconductor thin film transistors according to claim 3, wherein a waveform duty ratio of the clock signal is smaller than or equal to 25/75.

6. The scan driving circuit for the oxide semiconductor thin film transistors according to claim 5, wherein the waveform duty ratio of the clock signal is 25/75.

7. The scan driving circuit for the oxide semiconductor thin film transistors according to claim 1, wherein a signal output waveform of the first node appears to be convex.

8. The scan driving circuit for the oxide semiconductor thin film transistors according to claim 3, wherein the clock signal comprises four sets of clock signals: a first clock signal, a second clock signal, a third clock signal, a fourth clock signal, and when the clock signal is the third clock signal, the M+2 set clock signal is the first clock signal, and when the clock signal is the fourth clock signal, the M+2 set clock signal is the second clock signal.

9. A scan driving circuit for oxide semiconductor thin film transistors, comprising: a plurality of gate drive on array (GOA) units which are cascade connected, and N is set to be a positive integer and the Nth GOA unit comprises a pull-up control part, a pull-up part, a transfer part, a first pull-down part, a bootstrap capacitor part and a pull-down holding part;

the pull-up control part comprises an eleventh transistor, and a gate of the eleventh transistor is electrically coupled to a driving output end of a N−1th GOA unit which is the former stage of the Nth GOA unit, and a drain is electrically coupled to an output end of the N−1th GOA unit which is the former stage of the Nth GOA unit, and a source is electrically coupled to a first node;

the first pull-down part comprises a forty-first transistor, and a gate of the forty-first transistor is electrically coupled to a M+2 set clock signal, and a drain is electrically coupled to the first node, and a source is electrically coupled to a second negative voltage level or an output end;

the pull-down holding part comprises a fifty-first transistor, and both a gate and a drain of the fifty-first transistor are electrically coupled to a constant high voltage level, and a source is electrically coupled to a fourth node; a fifty-second transistor, and a gate of the fifty-second transistor is electrically coupled to the first node, and a drain is electrically coupled to the fourth node, and a source is electrically coupled to a first negative voltage level; a fifty-third transistor, and a gate of the fifty-third transistor is electrically coupled to the fourth node, and a drain is electrically coupled to the constant high voltage level, and a source is electrically coupled to a second node; a fifty-fourth transistor, and a gate of the fifty-fourth transistor is electrically coupled to the first node, and a drain is electrically coupled to the second node, and a source is electrically coupled to a third node; a seventy-first transistor, and both a gate and a drain of the seventy-first transistor are electrically coupled to the constant high voltage level, and a source is electrically coupled to the gate of a seventy-third transistor; a seventy-second transistor, and a gate of the seventy-second transistor is electrically coupled to the first node, and a drain is electrically coupled to the gate of the seventy-third transistor, and a source is electrically coupled to the constant low voltage level; a drain of the seventy-third transistor is electrically coupled to the constant high voltage level, and a source is electrically coupled to the third node; a seventy-fourth transistor, and a gate of the seventy-fourth transistor is electrically coupled to the first node, and a drain is electrically coupled to the third node, and a source is electrically coupled to a constant low voltage level; a forty-second transistor, and a gate of the forty-second transistor is electrically coupled to the second node, and a drain is electrically coupled to the first node, and a source is electrically coupled to the second negative voltage level; a thirty-second transistor, and a gate of the thirty-second transistor is electrically coupled to the second node, and a drain is electrically coupled to the output end, and a source is electrically coupled to the first negative voltage level;

the fifty-first transistor, the fifty-second transistor, the fifty-third transistor, the fifty-fourth transistor construct a main inverter, and the main inverter is employed to control the thirty-second transistor and the forty-second transistor; the seventy-first transistor, the seventy-second transistor, the seventy-third transistor and the seventy-fourth transistor construct an auxiliary inverter, and the auxiliary inverter is employed to provide a low voltage level to the main inverter in a functioning period, and a high voltage level to the main inverter in a non-functioning period;

a relationship among the first negative voltage level, the second negative voltage level and the constant low voltage level is that the constant low voltage level is less than the second negative voltage level, which is in turn less than the first negative voltage level;

wherein the pull-up part comprises a twenty-first transistor, and a gate of the twenty-first transistor is electrically coupled to the first node, and a drain is electrically coupled to a clock signal, and a source is electrically coupled to the output end;

the transfer part comprises a twenty-second transistor, and a gate of the twenty-second transistor is electrically coupled to the first node, and a drain is electrically coupled to the clock signal, and a source is electrically coupled to a driving output end; and the bootstrap capacitor part comprises a capacitor, and one end of the capacitor is electrically coupled to the first node, and the other end is electrically coupled to the output end;

wherein a waveform duty ratio of the clock signal is smaller than or equal to 25/75; and wherein a signal output waveform of the first node appears to be convex.

10. The scan driving circuit for the oxide semiconductor thin film transistors according to claim 9, wherein a stage transfer mode is that the N−1th stage transfers signals to the Nth stage.

11. The scan driving circuit for the oxide semiconductor thin film transistors according to claim 9, wherein in a first level connection of the scan driving circuit, both the gate and the drain of the eleventh transistor are electrically coupled to an activation signal end of the circuit.

12. The scan driving circuit for the oxide semiconductor thin film transistors according to claim 9, wherein the clock signal comprises four sets of clock signals: a first clock signal, a second clock signal, a third clock signal, a fourth clock signal, and when the clock signal is the third clock signal, the M+2 set clock signal is the first clock signal, and when the clock signal is the fourth clock signal, the M+2 set clock signal is the second clock signal.

* * * * *